(12) United States Patent
Ndip et al.

(10) Patent No.: US 10,424,827 B2
(45) Date of Patent: Sep. 24, 2019

(54) WAFER LEVEL PACKAGE WITH INTEGRATED OR EMBEDDED ANTENNA

(71) Applicant: Fraunhofer-Gesellschaft zur Foerderung der angewandten Forschung e.V., Munich (DE)

(72) Inventors: Ivan Ndip, Berlin (DE); Tanja Braun, Berlin (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 0 days.

(21) Appl. No.: 15/861,338

(22) Filed: Jan. 3, 2018

(65) Prior Publication Data
US 2018/0191053 A1    Jul. 5, 2018

(30) Foreign Application Priority Data
Jan. 5, 2017    (DE) .................. 10 2017 200 124

(51) Int. Cl.
| | |
|---|---|
| *H01L 23/00* | (2006.01) |
| *H01L 23/538* | (2006.01) |
| *H01L 23/552* | (2006.01) |
| *H01Q 1/22* | (2006.01) |
| *H01L 23/66* | (2006.01) |

(Continued)

(52) U.S. Cl.
CPC ....... *H01Q 1/2283* (2013.01); *H01L 23/5384* (2013.01); *H01L 23/5389* (2013.01); *H01L 23/552* (2013.01); *H01L 23/66* (2013.01); *H01L 24/19* (2013.01); *H01L 24/24* (2013.01); *H01L 24/73* (2013.01); *H01L 25/105* (2013.01); *H01L 2223/6677* (2013.01); *H01L 2224/24011* (2013.01); *H01L 2224/24101* (2013.01); *H01L 2224/24137* (2013.01);

(Continued)

(58) Field of Classification Search
None
See application file for complete search history.

(56) References Cited

U.S. PATENT DOCUMENTS

| | | |
|---|---|---|
| 6,770,955 B1 | 8/2004 | Coccioli et al. |
| 7,848,108 B1 | 12/2010 | Archambeault et al. |

(Continued)

FOREIGN PATENT DOCUMENTS

| | | |
|---|---|---|
| DE | 102006023123 A1 | 1/2007 |
| DE | 102010001407 A1 | 9/2010 |
| DE | 102013108075 A1 | 2/2014 |

OTHER PUBLICATIONS

Beck, Christopher et al., "Industrial mmWave Radar Sensor in Embedded Wafer-Level BGA Packaging Technology", IEEE Sensors Journal, vol. 16, No. 17, Sep. 1, 2016.

(Continued)

*Primary Examiner* — Herve-Louis Y Assouman
(74) *Attorney, Agent, or Firm* — Perkins Coie LLP; Michael A. Glenn

(57) ABSTRACT

A wafer level package with integrated antenna includes a contacting layer, a redistribution layer as well as a chip layer arranged between the contacting layer and the redistribution layer. An antenna is integrated in the redistribution layer. The antenna is shielded from the chip by means of a via, offset and provided with a reflector. Alternatively, the antenna can also be provided as antenna element in the chip layer.

24 Claims, 11 Drawing Sheets

(51) Int. Cl.
*H01L 25/10* (2006.01)
*H01Q 15/02* (2006.01)

(52) U.S. Cl.
CPC ............ *H01L 2224/25171* (2013.01); *H01L 2224/73259* (2013.01); *H01Q 15/02* (2013.01)

(56) References Cited

U.S. PATENT DOCUMENTS

| | | | |
|---|---|---|---|
| 2004/0041262 A1 | 3/2004 | Okamoto et al. | |
| 2005/0098348 A1 | 5/2005 | Okumichi et al. | |
| 2005/0151698 A1 | 7/2005 | Mohamadi | |
| 2007/0026567 A1* | 2/2007 | Beer | G01S 7/032 438/106 |
| 2007/0200748 A1 | 8/2007 | Hoegerl et al. | |
| 2008/0029886 A1 | 2/2008 | Cotte et al. | |
| 2008/0186247 A1 | 8/2008 | Cotte et al. | |
| 2008/0231518 A1 | 9/2008 | Tsutsumi et al. | |
| 2010/0193935 A1* | 8/2010 | Lachner | H01Q 1/2283 257/693 |
| 2011/0279190 A1 | 11/2011 | Liu et al. | |
| 2012/0062439 A1 | 3/2012 | Liao et al. | |
| 2012/0104574 A1 | 5/2012 | Boeck et al. | |
| 2012/0313253 A1 | 12/2012 | Nakadaira et al. | |
| 2013/0037950 A1 | 2/2013 | Yu et al. | |
| 2013/0292808 A1 | 11/2013 | Yen et al. | |
| 2014/0035154 A1 | 2/2014 | Geitner et al. | |
| 2014/0168014 A1* | 6/2014 | Chih | H01Q 1/2283 343/700 MS |
| 2014/0293529 A1 | 10/2014 | Nair et al. | |
| 2015/0194388 A1 | 7/2015 | Pabst et al. | |
| 2015/0207236 A1 | 7/2015 | Felic et al. | |
| 2015/0380386 A1 | 12/2015 | Vincent et al. | |
| 2016/0190038 A1 | 6/2016 | Koyama et al. | |
| 2016/0233178 A1* | 8/2016 | Lamy | H01Q 1/2283 |
| 2016/0240492 A1* | 8/2016 | Wolter | H01L 23/552 |
| 2016/0329299 A1* | 11/2016 | Lin | H01L 23/5226 |
| 2017/0236776 A1 | 8/2017 | Huynh et al. | |
| 2017/0345761 A1 | 11/2017 | Yu et al. | |

OTHER PUBLICATIONS

Keser, Beth et al., "The Redistributed Chip Package: A Breakthrough for Advance Packaging", Proceedings of ECTC 2007, Reno/Nevada, USA, 2007.

Meyer, T et al., "Embedded Wafer Level Ball Grid Array (eWLB)", Proceedings of EPTC 2008, Singapore, 2008.

Pourmousavi, M et al., "The Impact of Embedded Wafer Level BGA Package on the Antenna performance", 2013 IEEE-APS Topical Conference on Antennas and Propagation in Wireless Communications (APWC), 2013.

Tsai, Chung-Hao et al., "Array Antenna Integrated Fan-Out Wafer Level Packaing (InFO-WLP) for Millimeter Wave System Applicatioans", 2013 IEEE International Electronic Devices Meeting (IEDM), 9-11, Dec. 2013, pp. 25.1.1-25.1.4.

* cited by examiner

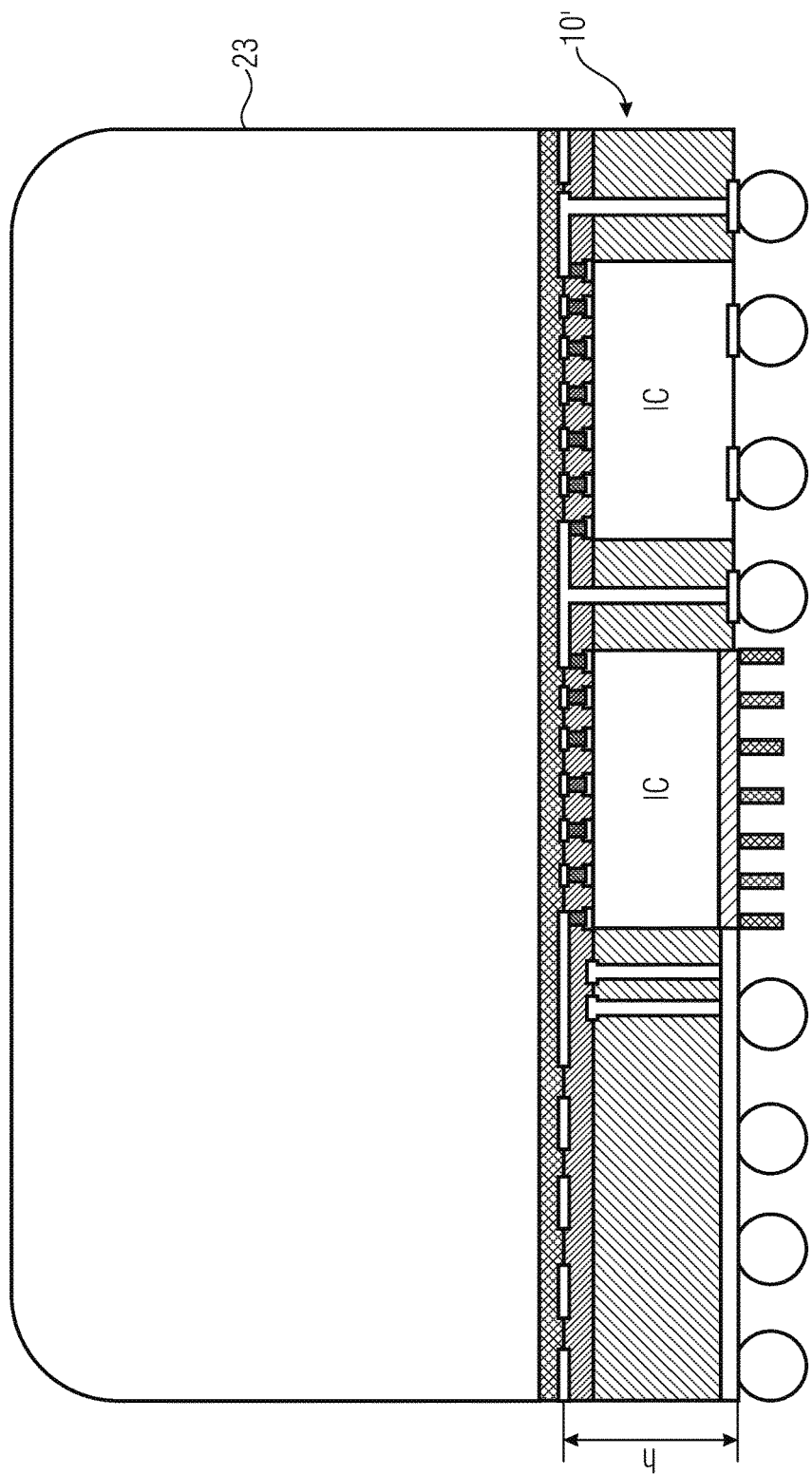

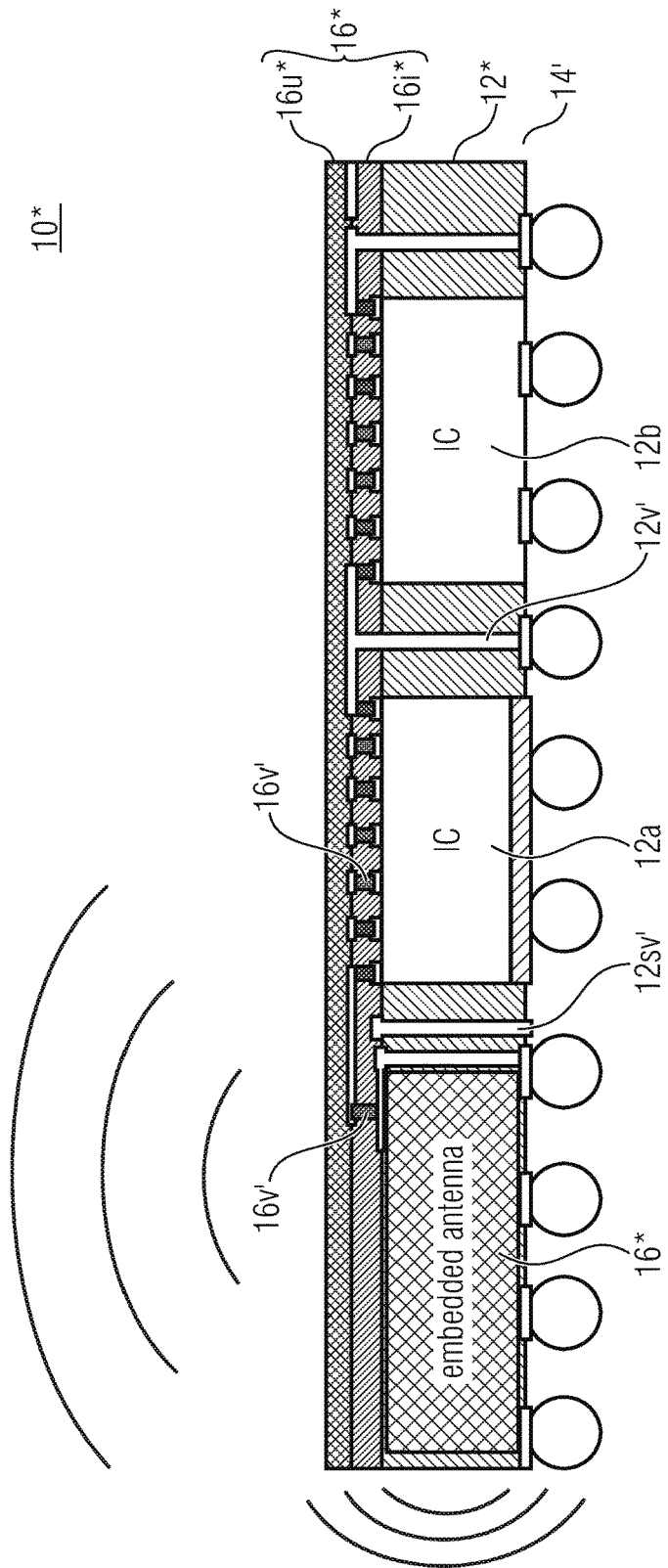

WAFER LEVEL PACKAGE WITH INTEGRATED OR EMBEDDED ANTENNA

CROSS-REFERENCE TO RELATED APPLICATIONS

This application claims priority from German Patent Application No. 10 2017 200 124.0, which was filed on Jan. 5, 2017, and is incorporated herein in its entirety by reference.

Embodiments of the present invention relate to a wafer level package with integrated antenna as well as a manufacturing method. Further embodiments relate to a wafer level package with integrated antenna element as well as respective manufacturing methods. Embodiments relate to a fan-out panel/wafer level-based system integration platform with integrated antenna or antenna embedded in a mold material.

BACKGROUND OF THE INVENTION

For meeting the increasing demand for more bandwidth, higher data rate, less latency and greater data security, chips having higher operating frequencies (e.g. in microwaves and millimeter wave frequency ranges) are used for developing wireless systems. But the higher the frequency, the higher the attenuation of the transmission path. For overcoming this attenuation, the wireless systems need antennas with high efficiency and gain. Antennas are the essential elements of wireless systems.

In wireless systems, antennas are integrated either in the chip, on the interposer or on the printed circuit board (system board). Chip-integrated antennas can result in higher system miniaturization and cost reduction since the same can be manufactured together with the chip at the same time. Above that, the electric connection between a front-end chip and an antenna is very short. However, such antennas have very little efficiency and gain which is due to the higher permittivity of chip material (e.g. silicon) as well as the substrate and metallization losses of the chip technologies. Thus, the same are not suitable for developing future high-frequency systems. Antennas that are integrated either on the interposer or on the printed circuit board can have much higher efficiency and gain as long as the antennas are manufactured with high-frequency substrates.

However, the signal path between a front-end chip and an antenna integrated on an interposer or a printed circuit board is long and consists of many geometric discontinuities (e.g. chip connections such as wire bonds, lines with bends, vias, etc.). This path causes signal integrity problems such as reflection, attenuation, signal delay, crosstalk and also undesired radiation, which decrease the entire system performance.

For preventing these problems, the antennas have to be integrated very close to the front-end chip. For that, system integration platforms allowing such integration are indispensable.

In conventional technology, there are several approaches how system integration has been established. Fan-out wafer level package (FO-WLP)-based system integration platforms have the potential of ensuring such integration. In FOWLP, no interposers are used, the integration of antennas can take place on the same substrate in which the chips are embedded. Thereby, the signal path between chips and antenna is reduced and the signal integrity problems are alleviated.

The three leading examples of FO-WLP-based system integration platforms are:
- Embedded Wafer Level Ball Grid Array (eWLB) by Infineon [1]
- Redistributed Chip Package (RCP) by Freescale [2]
- Integrated Fan-Out WLP (InFO-WLP) by TSMC [3]

So far, eWLB and InFO-WLP have been used and demonstrated for wireless systems. FIGS. 5a and 5b represent eWLB and InFO-WLP with integrated antennas.

FIG. 5a shows a combination of PCB 32 with eWLB 36 including a chip (e.g. RF chip) 38 as well as an antenna 42 arranged in the redistribution layer 40 of the eWLB 36. For improving the signal radiation characteristic, a reflector 44 is provided opposite to the antenna 42 on the PCB board 32.

FIG. 5b shows InFO-WLB integration. Here, the chip 38 is embedded in a cast resin 39, wherein the redistribution layer 40 is provided on the bottom side of the chip. Antenna elements 42 are arranged on the opposite side of the redistribution layer 40.

In eWLB, the radiating element of the antenna is integrated on the redistribution layer (RDL) and the reflector is integrated on the printed circuit board. Thereby, the functionality of the antennas and also of the platform depends on the dimensions of the package contacting, e.g. BGA balls and their process variations as well as on the printed circuit board technology. Thereby, the FOWLP system integration platform can be optimized only in connection with the contacts/BGA balls, the printed circuit board technologies and the underfill materials.

The antennas in eWLB and in InFO cannot be optimized without adapting the dimensions of the RDL and the mold material, which limits the freedom of design of the platform.

Both in eWLB and in InFO, the fields of the integrated antennas are not shielded from the chips and other integrated components. The undesired interaction can result in EMC problems.

In eWLB, the radiation of an integrated antenna cannot cover the entire hemisphere (the entire horizontal and vertical layer) without causing undesired coupling with other integrated components. The reason for that is that other components are integrated on the same layer as the antennas. Thus, there is a need for an improved approach.

SUMMARY

According to an embodiment, a wafer level package with integrated antenna may have: a contacting layer; a redistribution layer with the integrated antenna; a chip layer including at least one chip arranged between the contacting layer and the redistribution layer; wherein the integrated antenna is laterally arranged in the redistribution layer such that a projection area of the integrated antenna is offset from or partly overlapping with a projection area of the at least one chip; wherein the contacting layer includes a reflector and/or the reflector is arranged on a side facing away from the antenna; and wherein at least one shielding via is arranged between the at least one integrated antenna and the at least one chip, wherein the at least one shielding via is configured to establish shielding between the integrated antenna and the at least one chip.

According to another embodiment, a method for manufacturing a wafer level package with integrated antenna may have the steps of: providing a chip layer including at least one chip; depositing a contacting layer onto the chip layer; and depositing a redistribution layer on the chip layer such that the redistribution layer is arranged opposite to the contacting layer, wherein the redistribution layer includes at least the antenna; wherein the integrated antenna is arranged laterally in the redistribution layer such that a projection area of the integrated antenna is offset from or partly overlapping with the projection area of the at least one chip; wherein the contacting layer includes a reflector and/or the reflector is arranged on a side facing away from the antenna; and wherein at least one shielding via is arranged between the at least one integrated antenna and the at least one chip, wherein the at least one shielding via is configured to provide shielding between the integrated antenna and the at least one chip.

According to another embodiment, a wafer level package with integrated antenna may have: a contacting layer; a redistribution layer; and a chip layer including at least one chip as well as the integrated antenna, wherein the antenna is configured as individual component, arranged between the contacting layer and the redistribution layer; wherein a shielding via is arranged between the at least one chip and the antenna, which is configured to shield the chip and the antenna from one another.

According to another embodiment, a method for manufacturing a wafer level package with integrated antenna may have the steps of: providing at least one chip and at least one antenna element, wherein the antenna is configured as individual component; combining the at least one chip and the at least one antenna element to a chip layer; depositing a contacting layer on the chip layer; and depositing a redistribution layer on the chip layer such that the redistribution layer is arranged opposite to the contacting layer, arranging a shielding via between the at least one chip and the antenna, which is configured to shield the chip and the antenna from one another.

Another embodiment may have a wafer level package arrangement with an inventive wafer level package as well as one or several further wafer level packages.

Embodiments of an aspect of the present invention provide a wafer level package with integrated antenna. The wafer level package includes a contacting layer, a redistribution layer with the integrated antenna as well as a chip layer with at least one chip arranged between the contacting layer and the redistribution layer. According to embodiments, the integrated antenna is arranged in the antenna layer such that its projection area is offset from or at a maximum partly overlapping with the projection area of the at least one chip of the chip layer. The contacting layer includes a reflector for the antenna and the reflector is arranged on the side facing away from the antenna, respectively, in order to interact with the same. For protecting the chip from interferences of the electromagnetic radiation (RF), one (or several) so-called shielding vias are arranged beside the chip and between the chip and the antenna, respectively.

According to embodiments, the shielding via(s) is/are provided in the area between the antenna and the chips, i.e. integrated in the chip layer, e.g. at the edge of the chip. Additionally, the shielding vias can be provided as shielding via series or parallel series for further improving the shielding.

According to further embodiments, the integrated antennas can also be implemented in an "intelligent" manner, i.e. reconfigurable, controllable, adaptively and smart, respectively. The electronics (e.g. circuits and/or diodes) usually necessitated for reconfigurability can be integrated in the redistribution plane or in the polymer substrate. Here, according to further embodiments it would also be possible that the electronics for controlling the antenna (e.g. phase-shifter) is arranged either in the redistribution plane or in the polymer substrate.

Embodiments are based on the finding that it is, on the one hand, cost-efficient and generally improves the manufacturing process, respectively, when the antenna is arranged in the redistribution layer and the reflector in the opposite contacting layer, wherein disadvantages with regard to radiation losses due to the contacts (for contacting with a further element) can be reduced in that, in addition to the redistribution layer, a contact layer is provided on a side opposite with regard to the chip. Further, according to an additional embodiment, mutual interference of chip and antenna can be minimized when the antenna element is arranged offset from the chips in the redistribution layer and shielding means, such as vias, are provided between the radiating area and the chips.

By means of vias, which can also be provided in the chip layer according to further embodiments, it is possible that the redistribution layer is connected to the contacting layer. In that way, the chip can be contacted from the outside via the contacting layer and the redistribution layer. Additionally, it would also be possible that two-sided contacting of the chip is provided such that the chip would also be contactable on the side of the contacting layer. Here, it should be noted that according to embodiments also a dielectric layer can be provided between the redistribution layer and the chip layer.

According to embodiments, the characteristics of the antenna can be improved with different measures. For example, according to an embodiment, perforation in the area of the antenna is possible. Also, the chip layer, such as the so-called fan-out area could be provided in the area of the antenna by means of perforation structures. A further measure would be to provide a spacer with or without additional reflector in the area of the antenna in the chip plane. All these measures allow filtering and more generally adjusting the radiation to be emitted.

According to a further embodiment, a method is provided according to which the above stated wafer level package can be manufactured. Here, in a first step, the chip layer is manufactured together with the contacting layer. In a next step, the redistribution layer is deposited on a layer opposite to the contacting layer, wherein this redistribution layer includes at least the antenna.

An embodiment of a further aspect of the invention provides a wafer level package with integrated antenna element. Here, the wafer level package includes a contacting layer, a redistribution layer as well as a chip layer arranged therebetween, wherein an integrated antenna element is provided in an area of the chip layer, for example beside one of the chips. According to further embodiments, this integrated antenna element can be electrically contacted via the redistribution layers. The integrated antenna is arranged laterally in the redistribution layer such that a projection area of the integrated antenna is offset from or at a maximum partially overlapping with a projection area of the at least one chip.

The core idea of this aspect is that the lateral arrangement of the antenna element can also take place beside the chip directly in the chip layer. Such a wafer level package can be manufactured in a very simple and cost-effective manner, wherein generally in the design of the wafer level package it does not have to be considered how the further external elements are arranged, since the antenna is arranged laterally, such that the same radiates laterally and/or through the redistribution layer.

According to an embodiment, the wafer level package of the second aspect can also comprise a shielding via between the antenna element and the chips in order to reduce mutual electromagnetic interference.

According to further embodiments, the chip layer includes a polymer material embedding both the chips and one or several antenna elements. Here, it should be noted that according to embodiments the antenna element is configured as single component.

A further embodiment provides a manufacturing method of this wafer level package. Here, the chips and antenna elements are provided and combined to a chip layer in a next step. Then, the contacting layer is deposited on one side of the chip layer and the redistribution layer on the other side.

BRIEF DESCRIPTION OF THE DRAWINGS

Embodiments of the present invention will be detailed subsequently referring to the appended drawings, in which:

FIG. 2f is a schematic sectional view of a wafer level package with housing according to an embodiment; and FIG. 3 is a schematic sectional view of a wafer level package with integrated antenna element according to a further embodiment;

DETAILED DESCRIPTION OF THE INVENTION

Before embodiments of the present invention will be discussed below in more detail based on the accompanying drawings, it should be noted that functionally equal elements and structures are provided with the same reference numbers such that the description of the same is inter-exchangeable.

Figure 1:
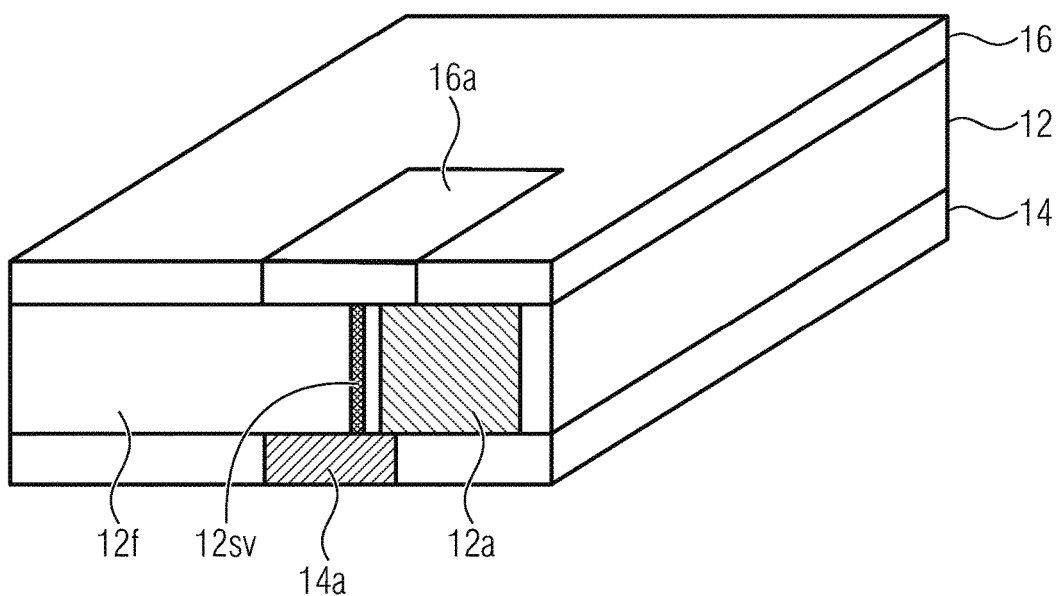
FIG. 1 is a schematic illustration of a wafer level package with integrated antenna according to a basic embodiment.

FIG. 1 shows a wafer level package 10 (arrangement of wafer levels into one unit) with a chip layer 12 as well as a contacting layer 14 arranged on a bottom side and first side, respectively, and a redistribution layer arranged on the top side and second side, respectively. By neglecting optionally existing isolation layers, this means that the chip layer 12 is metallized on both sides.

The chip layer 12 includes at least one chip 12a, such as an RF chip. This chip 12a is embedded in the chip layer 12, e.g. with the help of a polymer or another mold material. This "embedding area" is also referred to as fan-out area and is provided with the reference number 12f. The fan-out area is actually the area on the right or left of the embedded chip 12a, where other components, such as capacitances or resistances, can be embedded.

The layer 16 is the intermediate contacting layer in which also one or several antennas 16a are arranged. According to embodiments, with regard to projection, an offset is provided between the antennas 16a and the chip 12a, as illustrated herein. In other words, this means that the one or several antennas 16a are arranged in the fan-out area 12f. Depending on the exact arrangement, the chip 12a can either be connected directly to the antenna 16a (in the case of the minimum overlap) or, which is the advantageous variation (from an EMC point of view), the same can be arranged laterally from the chip in the fan-out area and can be connected via a line (not illustrated) in the redistribution layer 16.

Generally, the chip 12a is, on the one hand contacted via the redistribution layer 16 and optionally also via the contacting layer 14. Contacting the entire wafer level package can take place via the contacting layer 14 where also the reflector 14a is arranged opposite to the antenna 16a. For this, according to further embodiments, the contacting layer 14 can be connected by means of vias which extend through the mold material 12f (TMV). At least one further via 12sv for shielding is provided in the area between chip 12a and antenna 16a, i.e. e.g. in the so-called fan-out area.

Figure 2A:
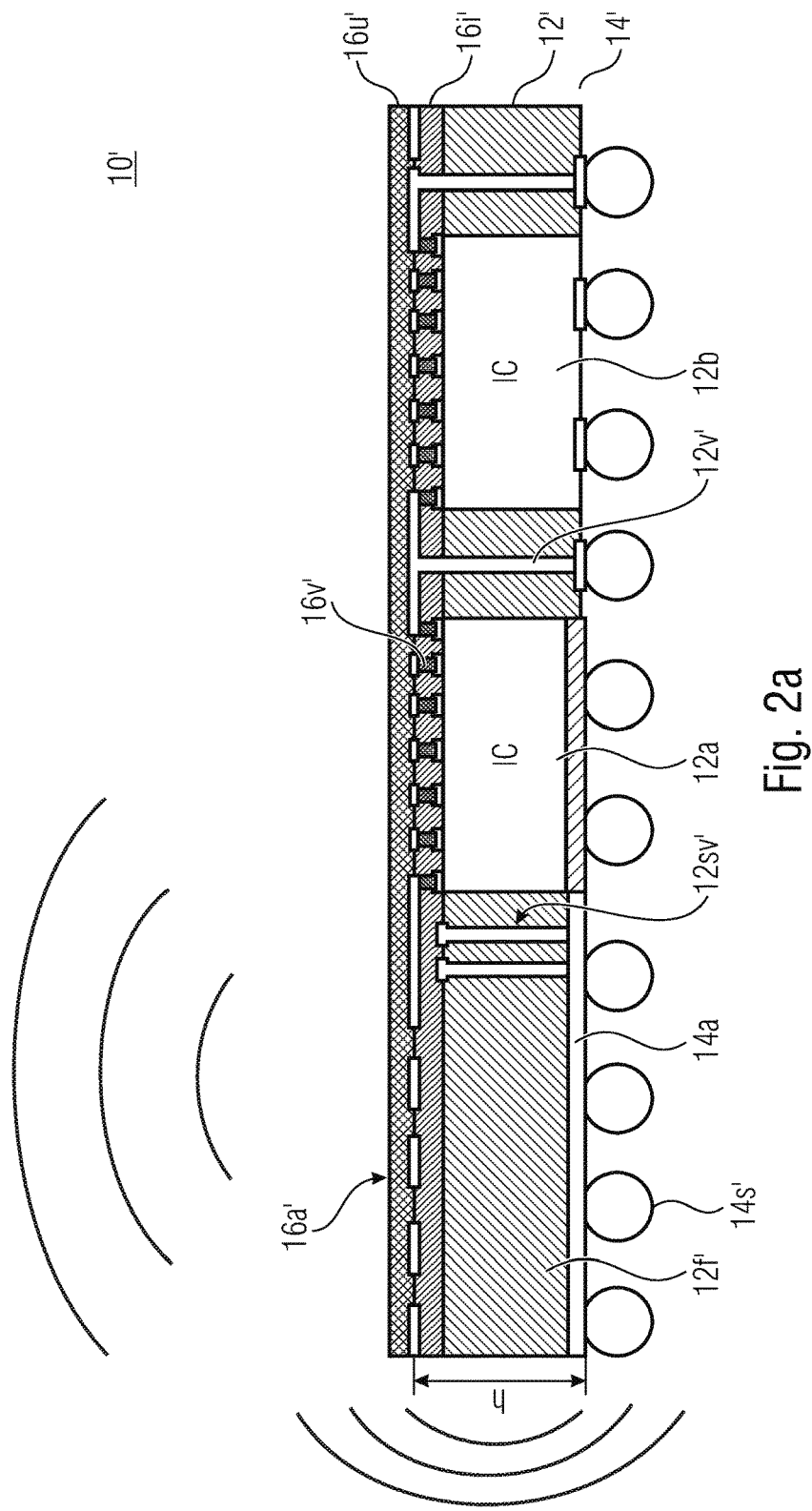
FIG. 2a-2d are schematic sectional views of a wafer level package according to extended embodiments.

With reference to FIG. 2a-d, extended embodiments are shown. FIG. 2a shows a wafer level package 10' with a chip layer 12', a contacting layer 14' and a redistribution layer 16'. Here, the antenna 16a' is also shielded from the chip 12a by means of shielding via(s) 12sv', offset with respect to the chip 12a and provided with a reflector 14a' in order to ensure optimum transmission characteristics with little interference of the chip 12a, 12b as will be discussed in more detail below.

The two chips 12a and 12b are provided in the chip layer 12', which are contactable on the bottom side via the contacting layers 14'. The contacting layer 14' includes solder balls 14s' as an example, which are configured, in particular in the area of the chips 12a and 12b, as so-called thermal balls for dissipating the temperatures from the IC 12a and 12b.

In this embodiment, the redistribution layer 16' actually includes two wiring layers, namely the actual redistribution layer 16u' and the isolation layer 16i'. This isolation layer 16i' is arranged between the actual redistribution layer 16u' and the chip layer 12'. Contact vias 16v' project through the isolation layer 16i, by means of which the ICs 12a and 12b are connected to the redistribution layer 16u' as well as the antenna 16a'. These vias are embedded in the isolation layer 16i. Also, the redistribution layer 16u' includes the antenna 16a'. Here, the same is arranged in the fan-out area 12s'. Due to this arrangement, a very short signal path having very little discontinuities results, which improves the signal integrity in particular for millimeter waves and/or terahertz signals. Alternatively, the redistribution layer can also consist of a metallization layer and two dielectric layers. The metallization layer is used for connecting chips and antennas. The radiating elements of the antenna are also realized in the metallization layer.

Depending on the antenna configuration, the radiation of the antenna 16a' can take place out of the layer (floor plane) or out of the lateral layer (azimuth plane) or from both planes (as illustrated herein). The antenna configuration is adjustable, for example via the used materials in the fan-out area 12f', in the same area of the isolation area 16i' and via the height (cf. reference number h) as well as the reflector 14a'. Here, it should also be noted that different antennas (both individual elements and arrays/array antennas with several elements) can be used, such as patch antenna, grid array, slit antenna, substrate-integrated waveguide (SIW)-based antenna, dipole, monopole, etc.

According to further embodiments, as illustrated herein, the redistribution layer 16u' can be connected to the contacting layer 14' by means of vias 12v'. These vias project through the fan-out area 12f through the chip layer 12'.

According to the advantageous variation, additional vias and several rows of vias, respectively, are provided as so-called shielding vias $12sv'$, which are arranged between the antenna $16a'$ and the chips $12a$ and $12b'$ such that the same carry out shielding of the radiation emitted by the antenna $16a'$ and generally all relevant EMC interferences between IC $12a/12b$ and antenna $16a'$, respectively. Thereby, EMC problems are mostly prevented since both interference of the antenna $16a'$ by the chips $12a$ and $12b$ and vice versa is prevented. The shielding vias $12sv'$ are not (electrically) connected to the chip $12a/12b$ and/or reflector $14a'$.

According to further embodiments, passive devices such as inductances, resistors, capacitors, filters, or other elements can be provided both in the redistribution layer $16u'$ and in the fan-out area $12f'$. In case these elements are arranged in the chip layer $12'$, contacting can take place via the redistribution layer $16'$.

Regarding the solder balls $14s$ already explained above, it should be noted that for the same normally the wafer level package (EWLB) is deposited on a printed circuit board (e.g. PCB) such that signal exchange also takes place via the solder balls $14s'$.

Figure 2B:
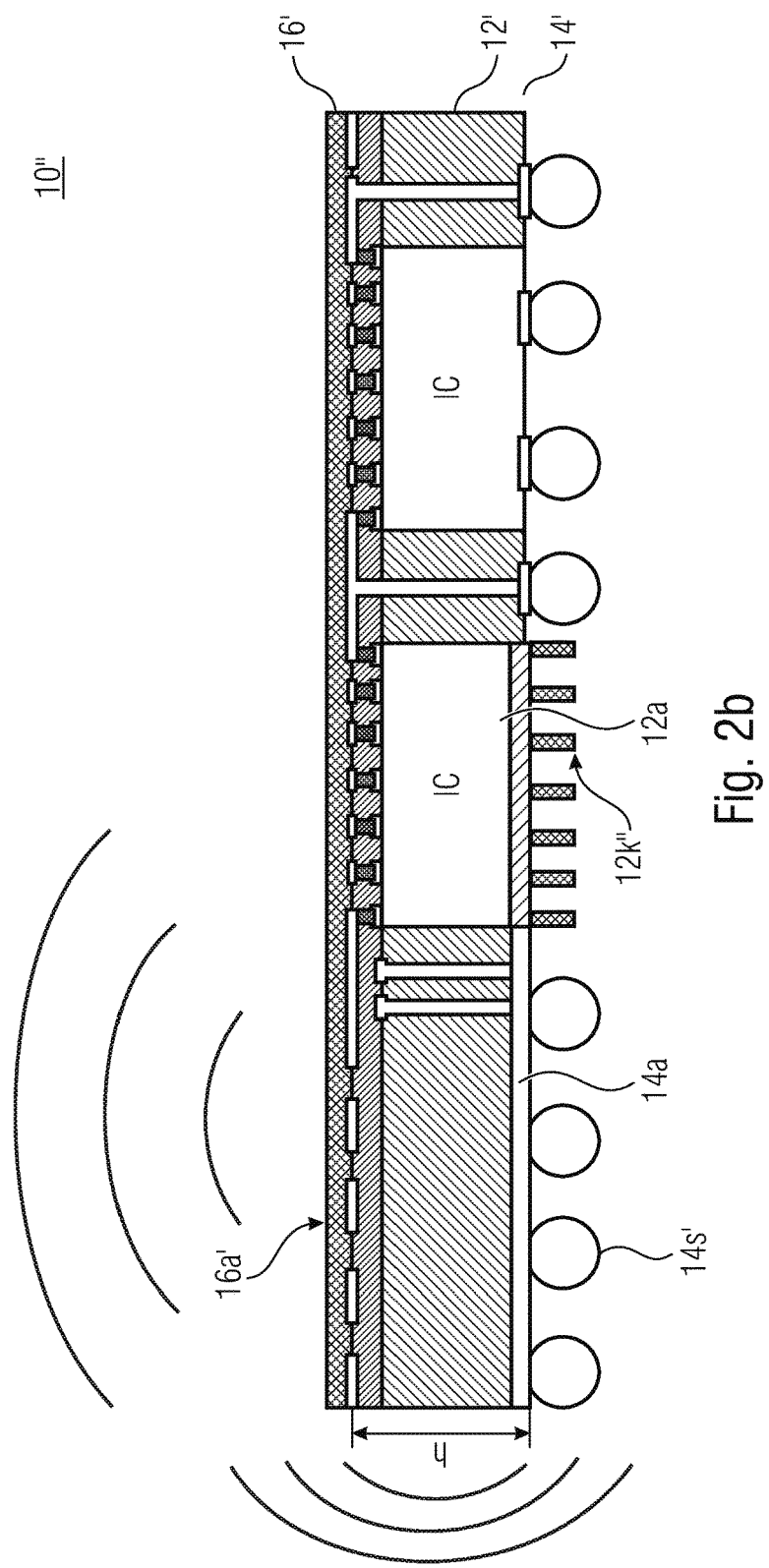

FIG. 2b shows an amended wafer level package $10''$ which is amended with respect to the wafer level package $10'$ such that in the area of the ICs $12a$ further means for cooling $12k''$, namely a cooling body $12k''$, is provided instead of the solder balls $14s'$. The cooling body $12k''$ spreads the heat into the environment under the chip $12a$ and the solder balls $14s'$ direct the heat into the next package level, e.g. the system board.

Figure 2C:
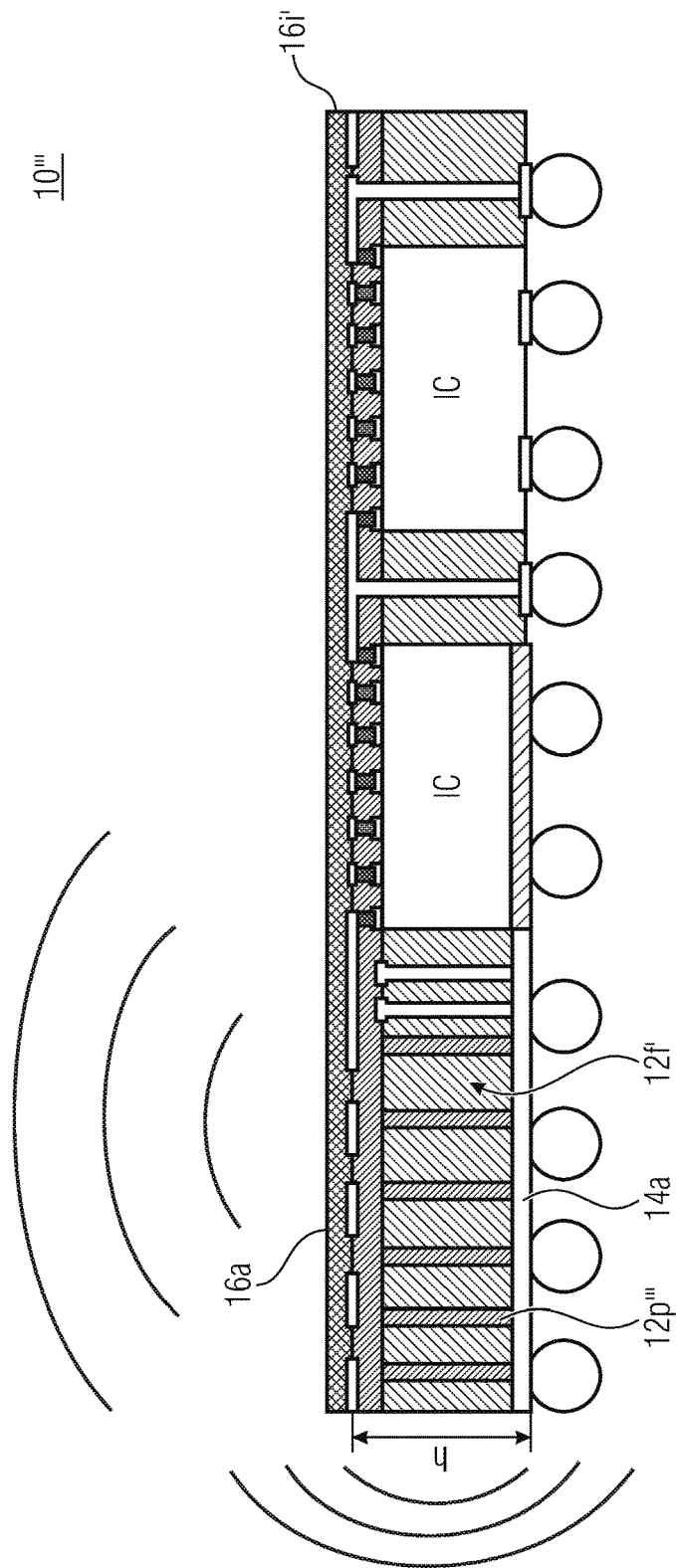

FIG. 2c shows a further embodiment of a wafer level package $10'''$ which differs from the wafer level package $10'$ in that perforation structures $12p'''$ are provided in the fan-out area $12f'''$. This fan-out area $12f'''$ acts as a dielectric for the antenna $16a'$ and hence includes a suitable RF material. Here, it should be noted that the dielectric that is used for embedding the chips also serves as dielectric of the antennas.

In these embodiments, the periodic holes $12p'''$ allow the formation of a photonic bandgap structure that results in filtering the surface waves and hence in improving the radiation characteristic. Further, the value of the effective permittivity of the substrate is reduced due to these holes $12p'''$. Thereby, the edge length of the antenna structure is increased at higher frequencies and the influence of process variations becomes lower. By integrating electromagnetic bandgap chips also into the isolation layer $16i'$, the radiation characteristic of the antenna $16a'$ can be improved.

Figure 2D:
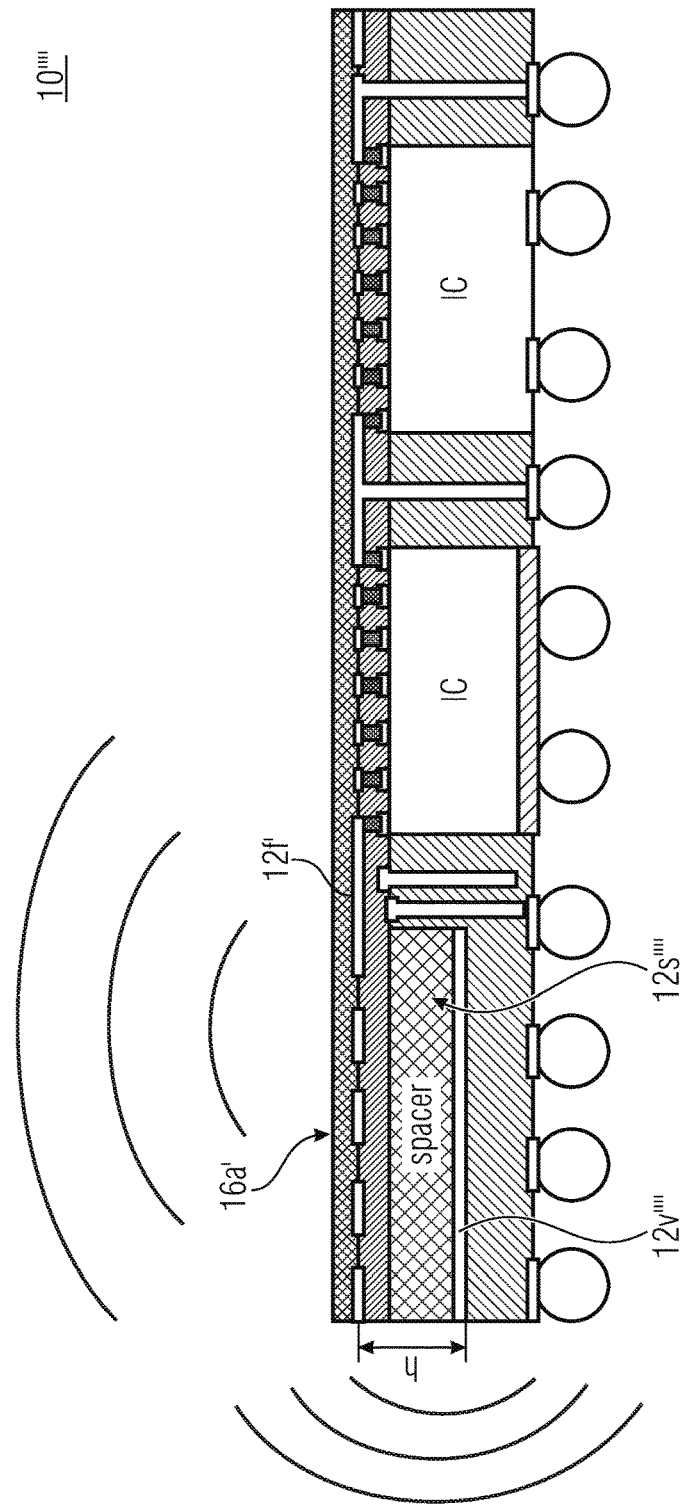

FIG. 2d shows a different optimization of the fan-out area $12f'$ of the wafer level package $10'''$ in the area of the antenna $16a'$. As can be seen, a so-called spacer $12s''''$ is provided in the fan-out area $12f'$. This spacer $12s''''$ allows the adjustment of the height h and hence of the thickness of the antenna substrate. At the end of the spacer, i.e. on the opposite side of the spacer $12s''''$ as seen from the antenna $16a'$, a reflector $12r''''$, e.g. of metal, can be provided. Therebetween lies normally a dielectric material of the spacer $12s''''$ which has to be particularly considered in the design of the antenna $16a'$.

Here, it should be noted that the individual features as discussed in FIGS. 2a to 2d can be combined in any manner.

Figure 2E:
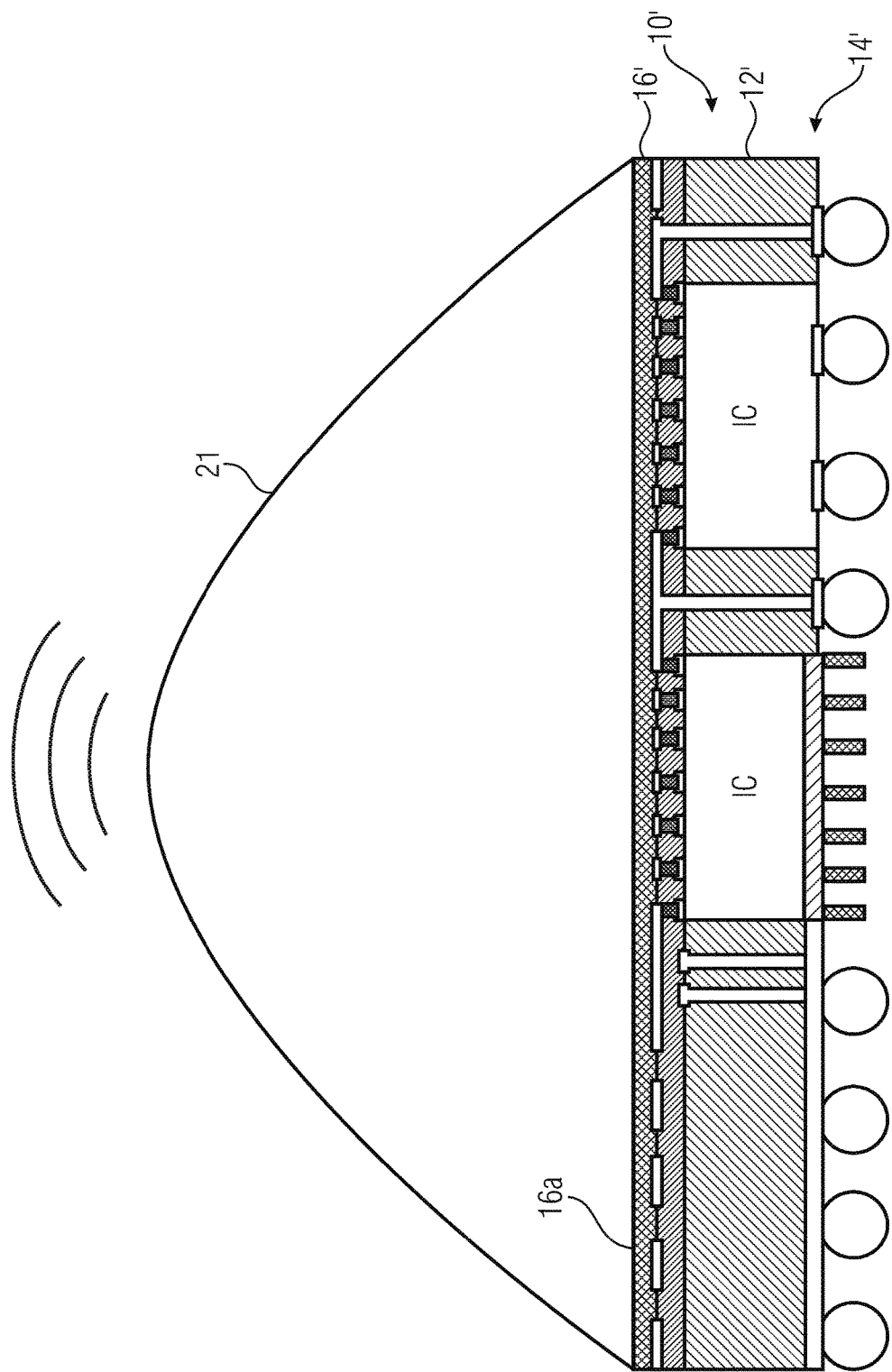
FIG. 2e is a schematic sectional view of a wafer level package with lens according to an embodiment.

FIG. 2e shows the wafer level package $10'$ of FIG. 2a with chip layer $12'$, contacting layer $14'$ and redistribution layer $16'$. In this embodiment, the wafer level package $10'$ comprises an additional lens $21$ (means for beamforming the electromagnetic wave emitted by the antenna) on the top side (main surface) adjacent to the antenna $16a'$. The lens $21$ serves for vertical focusing of the antenna beam.

FIG. 2f shows again the wafer level package $10'$ of FIG. 2a in combination with a housing $23$ arranged on the top side (side of the redistribution layer $16'$). The housing $23$ is made of glass or another non-shielding material. The housing $23$ can be filled, for example with air or a dielectric material having low losses. Further, the housing $23$ can also contribute to beamforming/focusing of the electromagnetic wave.

Both housing $23$ and lens $21$ are applicable together and in combination with all above explained embodiments/wafer level packages.

FIG. 3 shows a further embodiment, namely the wafer level package $10^*$ that essentially corresponds to the wafer level package $10'$, wherein here, however, the antenna is not arranged in the redistribution layer $16^*$ including the actual redistribution layer $16u^*$ and the installation layer $16i^*$ but in the chip layer $12^*$.

However, the chip layer $12^*$ includes the two ICs $12a$ and $12b$, wherein in the area referred to above as fan-out area an embedded antenna $16^*$ is provided. Here, it should be noted that different antennas (both individual elements as well as arrays/array antennas with several elements) can be used, such as patch antenna, grid array, slit antenna, substrate-integrated waveguide (SIW)-based antenna, dipole, monopole, etc. This antenna $16^*$ can, for example, also be a hybrid antenna. According to embodiments, contacting of the antenna $16^*$ takes place by means of the redistribution layer $16u^*$, i.e. the chip $12a/12b$ (RF chip) is connected to the antenna$^*$ with the help of the redistribution layer $16u^*$. As already discussed in the context of FIG. 2a, contacting of the antenna element $16^*$ as well as the chips $12a$ and $12b$ takes place through the isolation layer $16i^*$ by means of vias $16v'$. For completeness sake, it should be noted that the embodiment $10^*$ discussed herein also includes a contacting layer $14'$.

According to embodiments, as explained, for example, in the context of FIG. 2a, a shielding via $12sv$ and a series of shielding vias $12sv$, respectively, can be provided between the antenna $16^*$ and the chip $12a$.

According to further embodiments, the isolation layer $16i^*$ acts as part of the dielectric of the antenna in the area of the antenna.

The functionality of the wafer level package $10^*$ with the integrated antenna $16^*$ essentially corresponds to the antennas discussed above. The advantage of this configuration is that the antenna $16^*$ can be manufactured and tested in a completely independent manner, since the antenna $16^*$ is embedded into the chip layer $12^*$ like a chip. Further, it is also advantageous that the design, dimensioning and optimization of the antenna $16^*$ can be performed independent of the further elements.

In this embodiment, the features (perforation of the isolation layers or spacer) as discussed in FIGS. 2a to 2d can also be used.

According to a further embodiment, a system is provided where the wafer level package is connected to (at least) one further (different or same) wafer level package. The connection takes place, e.g. via the contacting layer. The further wafer level package can, e.g. also include one or several antennas (array) such that a three-dimensional antenna structure is provided as a result.

Figure 4:
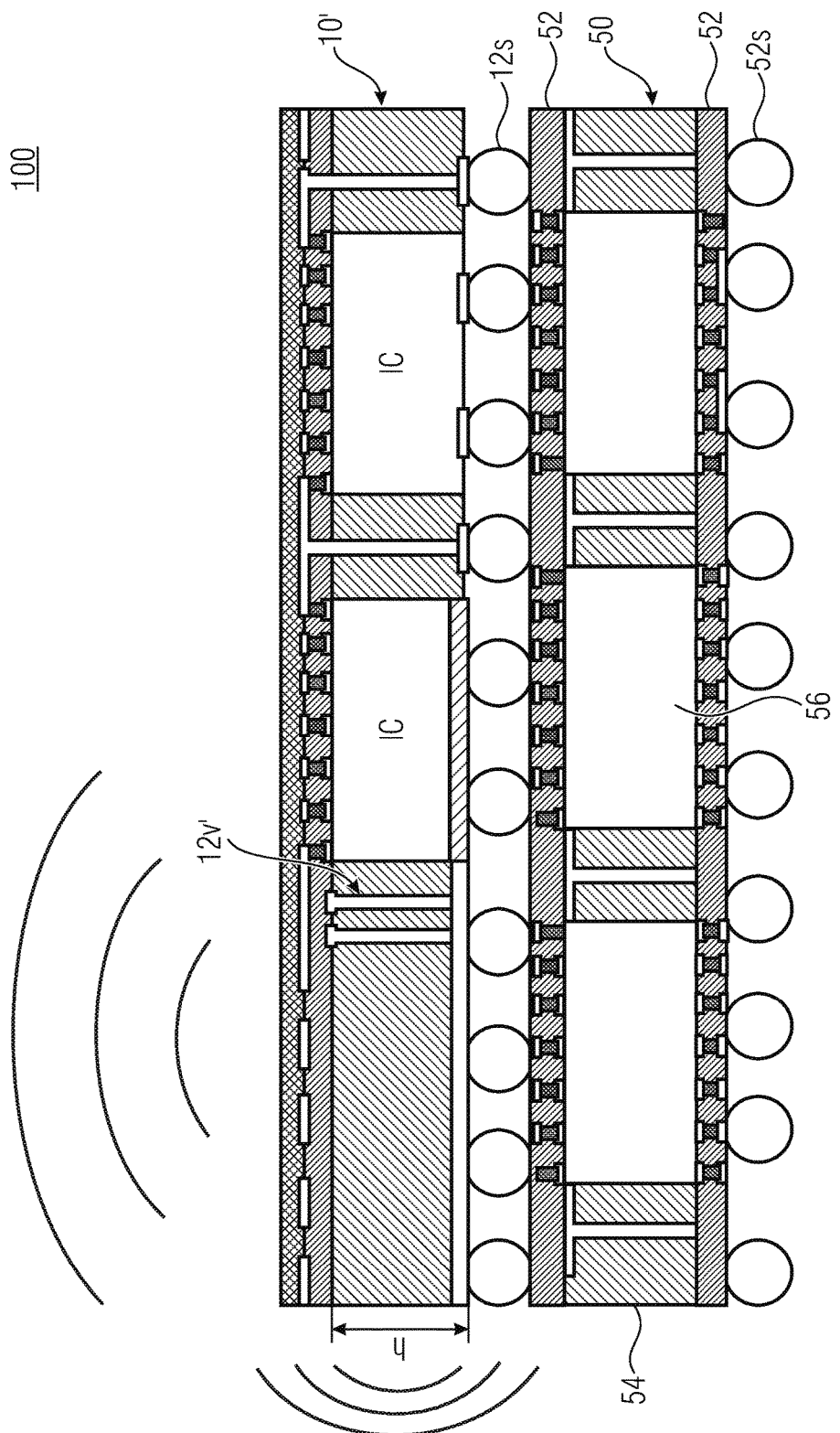
FIG. 4 is a schematic sectional view of a wafer level package with integrated antenna or antenna element in combination with a further wafer level package according to a further embodiment.
Figure 5A:
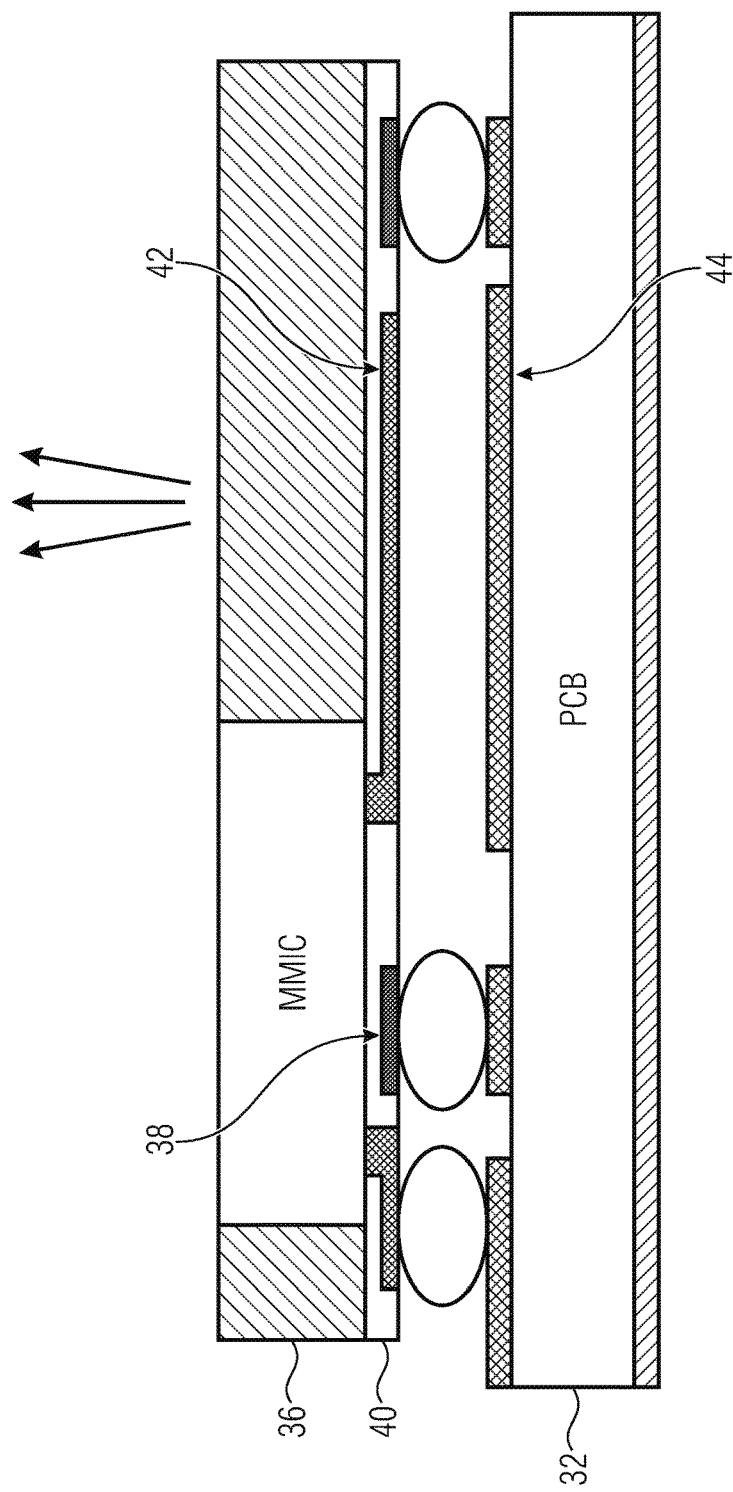
FIG. 5a-5b are schematic illustrations of conventional approaches of wafer level packages.
Figure 5B:
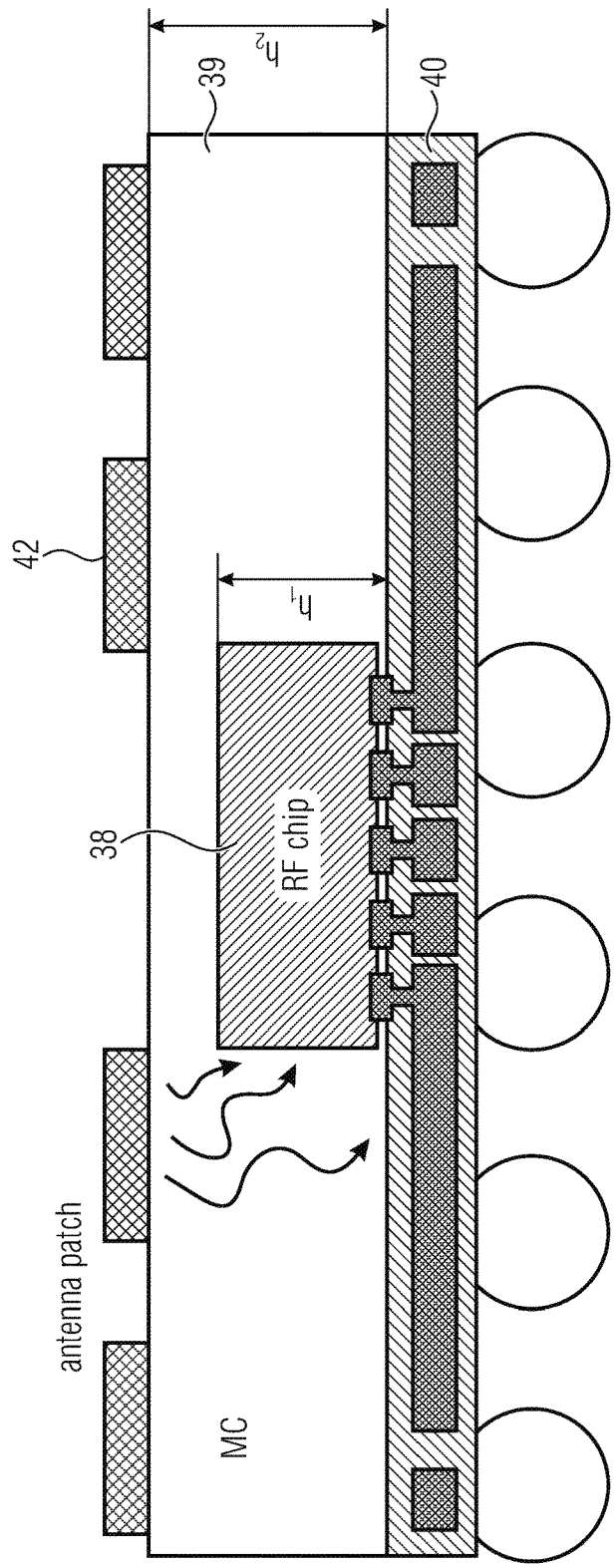

FIG. 4 shows a further embodiment, namely essentially the integration of one of the above-explained wafer level packages $10$, $10'$, $10''$, $10'''$, $10''''$, or $10^*$ in a wafer level package arrangement $100$. Here, the wafer level package $10'$ is illustrated exemplarily in combination with a further wafer level package 50, wherein the other wafer level packages 10, 10', 10'', 10''', 10'''' or 10\* could also be combined.

The two wafer level packages 10' and 50 are connected to one another with the help of the solder balls 12s, wherein the wafer level package 50 comprises a contacting layer 52 both on the top side and on the bottom side. A chip layer 54 is provided between these two contacting layers 52, which, in this embodiment, have at least three elements 650, which can, for example, be chips or other devices. Analogously to the wafer level package 10, the chip layer 54 is connected to the three devices 56 with the help of a mold material, such as a polymer.

On the bottom side of the wafer level package 50, the contacting layer 52 is also provided with solder balls 52s, such that the entire unit 100 can be connected to further wafer level packages or to a printed circuit board.

On the one hand, this embodiment offers the option that the entire wafer level package arrangement 100 grows into the third dimension, such that also higher complexities can be realized.

Although the above embodiments have been especially described in the context of a structure, it should be noted that further embodiments relate to the respective manufacturing methods.

The manufacturing method for the wafer level packages 10, 10', 10'', 10''' and 10'''' includes the steps of providing a chip layer as well as depositing the redistribution layer 16' and 16, respectively, as well as the contacting layer 14' and 14, respectively. Here, the redistribution layer 16 and 16', respectively, and 16u', respectively, is deposited such that the antenna 16a' is formed.

A further embodiment relates to the manufacturing of the wafer level package 10'. Here, in a first step, the chips 12a and 12b as well as the antenna 16\* to be embedded are arranged such that the same are arranged beside one another in a layer which then forms the future chip layer 12x. Then, the elements 16\*, 12a and 12b are connected to one another, for example with the help of a cast resin or another polymer material in order to produce the layer 12\*. In a subsequent step, the metallization layers and the contacting layer 14', respectively, as well as the redistribution layer 16\* including the isolation layer 16i\* and the actual redistribution layer 16u\* are deposited.

The fields of application are manifold. The platform 10, 10', 10'', 10''' and 10'''' and/or 10\* and the module 100, respectively, can be used for developing wireless communication systems that can be used in all frequency ranges of the electromagnetic spectrum, e.g. for WPAN, WLAN, mobile radio, satellites, backhaul, wireless infrastructure, etc.

The same can also be used for developing wireless sensor systems that can be used for any applications in all frequency ranges of the electromagnetic spectrum.

Further, the platform 10, 10', 10'', 10''' and 10'''' and/or 10\* and the module 100, respectively, can be used for developing radar systems that can be used for any applications in all frequency ranges of the electromagnetic spectrum.

As already mentioned above, the integrated antenna can be implemented as antenna array or can include an antenna array, e.g. with a plurality of antennas (>5 or even >1000). Here, the several antennas are arranged beside one another such that no or only a minimum overlap with other elements, such as the chips, results.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

REFERENCES

[1] T. Meyer, G. Ofner, S. Bradl, M. Brunnbauer, R. Hagen, Embedded Wafer Level Ball Grid Array (eWLB); Proceedings of EPTC 2008, Singapore.
[2] B. Keser, C. Amrine, T. Duong, O. Fay, S. Hayes, G. Leal, W. Lytle, D. Mitchell, R. Wenzel; The Redistributed Chip Package: A Breakthrough for Advanced Packaging, Proceedings of ECTC 2007, Reno/Nevada, USA.
[3] Chung-Hao Tsai et Al., Array Antenna Integrated Fan-out Wafer Level Packaging (InFO-WLP) for Millimeter Wave System Applications", 2013 IEEE International Electronic Devices Meeting (IEDM), 9-11 Dec. 2013, pp. 25.1.1-25.1.4.
[4] Christopher Beck, et al., Industrial mmWave Radar Sensor in Embedded Wafer Level BGA Packaging Technology", IEEE SENSORS JOURNAL, VOL. 16, NO. 17, Sep. 1, 2016

The invention claimed is:

1. Wafer level package with integrated antenna, comprising:
    a contacting layer;
    a redistribution layer with the integrated antenna;
    a chip layer comprising at least one chip arranged between the contacting layer and the redistribution layer;
    wherein the integrated antenna is laterally arranged in the redistribution layer such that a projection area of the integrated antenna is offset from or partly overlapping with a projection area of the at least one chip;
    wherein the contacting layer comprises a reflector and/or the reflector is arranged on a side facing away from the antenna; and
    wherein at least one shielding via is laterally arranged between a main radiation surface of the at least one integrated antenna and the at least one chip, wherein the at least one shielding via is configured to establish shielding between the integrated antenna and the at least one chip.

2. Wafer level package according to claim 1, wherein the integrated antenna is implemented as antenna array or comprises an antenna array.

3. Wafer level package according to claim 1, wherein the chip layer comprises polymer material that is arranged beside the at least one chip.

4. Wafer level package according to claim 3, wherein at least one via projects through the polymer material such that the redistribution layer is contacted.

5. Wafer level package according to claim 1, wherein the at least one shielding via is formed as a series of shielding vias.

6. Wafer level package according to claim 1, wherein the chip is contacted on both sides.

7. Wafer level package according to claim 1, wherein a dielectric is arranged between the chip layer and the redistribution layer.

8. Wafer level package according to claim 1, wherein the dielectric is perforated at least in part of an area of the integrated antenna.

9. Wafer level package according to claim 3, wherein the polymer material comprises at least one perforation structure in the area of the integrated antenna.

10. Wafer level package according to claim 3, wherein the polymer material comprises a spacer at least in one part of the area of the antenna.

11. Wafer level package according to claim 1, wherein the reflector is arranged overlapping with the projection area of the integrated antenna.

12. Wafer level package according to claim 1, wherein the at least one chip comprises a temperature dissipator on a side facing away from the redistribution layer.

13. Wafer level package according to claim 1, wherein the wafer level package comprises a lens that is configured to cooperate with at least one integrated antenna.

14. Wafer level package arrangement with a wafer level package according to claim 1 as well as one or several further wafer level packages.

15. Method for manufacturing a wafer level package with integrated antenna, comprising:
   providing a chip layer comprising at least one chip;
   depositing a contacting layer onto the chip layer; and
   depositing a redistribution layer on the chip layer such that the redistribution layer is arranged opposite to the contacting layer, wherein the redistribution layer comprises at least the antenna;
   wherein the integrated antenna is arranged laterally in the redistribution layer such that a projection area of the integrated antenna is offset from or partly overlapping with the projection area of the at least one chip;
   wherein the contacting layer comprises a reflector and/or the reflector is arranged on a side facing away from the antenna; and
   wherein at least one shielding via is laterally arranged between a main radiation surface of the at least one integrated antenna and the at least one chip, wherein the at least one shielding via is configured to provide shielding between the integrated antenna and the at least one chip.

16. Method according to claim 15 comprising the step of introducing one or several vias through the polymer material, such that the redistribution layer is contacted.

17. Wafer level package with integrated antenna, comprising:
   a contacting layer;
   a redistribution layer; and
   a chip layer comprising at least one chip as well as the integrated antenna, wherein the antenna is configured as individual component, arranged between the contacting layer and the redistribution layer;
   wherein a shielding via is laterally arranged between a main radiation surface of the at least one chip and the antenna, which is configured to shield the chip and the antenna from one another.

18. Wafer level package according to claim 17, wherein the integrated antenna is electrically connected to the chip layer via the redistribution layer.

19. Wafer level package according to claim 17, wherein the chip layer comprises a polymer material.

20. Wafer level package according to claim 19, wherein the redistribution layer is connected to the contacting layer by means of a via.

21. Wafer level package according to claim 17, wherein the at least one chip comprises a temperature dissipator on a side facing away from the redistribution layer.

22. Wafer level package according to claim 17, wherein the wafer level package comprises a lens that is configured to cooperate with at least one integrated antenna.

23. Wafer level package arrangement with a wafer level package according to claim 17 as well as one or several further wafer level packages.

24. Method for manufacturing a wafer level package with integrated antenna, comprising:
   providing at least one chip and at least one antenna element, wherein the antenna is configured as individual component;
   combining the at least one chip and the at least one antenna element to a chip layer;
   depositing a contacting layer on the chip layer; and
   depositing a redistribution layer on the chip layer such that the redistribution layer is arranged opposite to the contacting layer,
   laterally arranging a shielding via between the at least one chip and a main radiation surface of the antenna, which is configured to shield the chip and the antenna from one another.

* * * * *